United States Patent
Bobba et al.

(10) Patent No.: US 6,897,563 B2
(45) Date of Patent: May 24, 2005

(54) CURRENT CROWDING REDUCTION TECHNIQUE USING SELECTIVE CURRENT INJECTION

(75) Inventors: Sudhaker Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 230 days.

(21) Appl. No.: 10/034,732

(22) Filed: Dec. 28, 2001

(65) Prior Publication Data

US 2003/0122259 A1 Jul. 3, 2003

(51) Int. Cl.[7] .................... H01L 23/48; H01L 23/52; H01L 29/40
(52) U.S. Cl. ............ 257/774; 257/773; 257/778; 257/786; 257/780; 257/781; 257/784; 257/698
(58) Field of Search ............... 257/774, 778, 257/786, 781, 698, 780, 784, 773

(56) References Cited

U.S. PATENT DOCUMENTS

| | | | | |
|---|---|---|---|---|
| 5,248,903 A | * | 9/1993 | Heim | ............ 257/748 |
| 5,404,047 A | * | 4/1995 | Rostoker et al. | ............ 257/786 |
| 5,502,337 A | * | 3/1996 | Nozaki | ............ 257/773 |
| 5,736,791 A | * | 4/1998 | Fujiki et al. | ............ 257/781 |
| 6,313,537 B1 | * | 11/2001 | Lee et al. | ............ 257/758 |
| 6,365,970 B1 | * | 4/2002 | Tsai et al. | ............ 257/751 |
| 6,566,758 B1 | * | 5/2003 | Trivedi et al. | ............ 257/774 |

* cited by examiner

*Primary Examiner*—George Eckert
*Assistant Examiner*—Chris Chu
(74) *Attorney, Agent, or Firm*—Osha & May L.L.P.

(57) ABSTRACT

A technique for reducing current crowding on a bump using selective current injection is provided. The technique allows a bump to more uniformly inject current around the bump from vias on a metal layer, where the vias are concentrated on outer regions of the metal layer and have higher via density than that of a central region of vias on the metal layer. Because vias are concentrated on the outer regions of the metal layer, higher current distribution density along current flow paths from the outer regions to the bump compensates for a shorter current path length from the central region to the bump, thus effectively reducing current crowding on the bump. Further, a technique for selectively positioning regions of vias on a metal layer in order to reduce current crowding on a bump is provided.

28 Claims, 9 Drawing Sheets

CURRENT CROWDING REDUCTION TECHNIQUE USING SELECTIVE CURRENT INJECTION

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components in the computer system (10).

An integrated circuit, such as the ones shown in FIG. 1, is electrically connected to a circuit board via a chip package. A chip package, which houses semiconductor devices in strong, thermally stable, hermetically sealed environments, provides a semiconductor device, e.g., the integrated circuit, with electrical connectivity to circuitry external to the semiconductor device. FIG. 2 shows one prior art type of chip package assembly that involves wire bond connections. The wire bonding process involves mounting a integrated circuit (30) to a substrate (32) with its inactive backside (34) down. Wires (not shown) are then bonded between an active side (36) of the integrated circuit (30) and the chip package (not shown).

FIG. 3 shows a more recently developed type of chip package assembly known as "flip-chip" packaging. In flip-chip package technology, an integrated circuit (40) is mounted onto a chip package (42), where the active side of the integrated circuit (40) is electrically interfaced to the chip package (42). Specifically, the integrated circuit (40) has bumps (44) on bond pads (not shown and also known and referred to as "landing pads") formed on an active side (46) of the integrated circuit (40), where the bumps (44) are used as electrical and mechanical connectors. The integrated circuit (40) is inverted and bonded to chip package (42) by means of the bumps (44). Various materials, such as conductive polymers and metals (referred to as "solder bumps"), are commonly used to form the bumps (44) on the integrated circuit (40).

As discussed above with reference to FIG. 3, the bumps (44) on the integrated circuit (40) serve as electrical pathways between the components within the integrated circuit (40) and the chip package (42). Within the integrated circuit (40) itself, an arrangement of conductive pathways and metal layers form a means by which elements in the integrated circuit (40) operatively connect to the bumps (44) on the outside of the integrated circuit (40). To this end, FIG. 4a shows a side view of the integrated circuit (40). The integrated circuit (40) has several metal layers, M1–M8, surrounded by some dielectric material (48), e.g., silicon dioxide. The metal layers, M1–M8, are connected to each other by conductive pathways (50) known as "vias." Vias (50) are essentially holes within the dielectric material (48) that have been doped with metal ions.

Circuitry (not shown) embedded on a substrate of the integrated circuit (40) transmit and receive signals via the metal layers, M1–M8, and the vias (50). Signals that need to be transmitted/received to/from components external to the integrated circuit (40) are propagated through the metal layers, M1–M8, and vias (50) to the top metal layer, M8. The top metal layer, M8, then transmits/receives signals and power to/from the bumps (44) located on the active side of the integrated circuit (40).

FIG. 4b shows a top view of the integrated circuit (40) shown in FIG. 4a. The top metal layer, M8, as shown in FIG. 4b, has a number of parallel regions. These parallel regions alternate between regions connected to $V_{DD}$ and regions connected to $V_{SS}$. Such a configuration helps reduce electromagnetic interference. The top metal layer, M8, is configured such that it is orthogonal with the metal layer below, M7, as shown in FIG. 4b. Further, bumps (44) on the top metal layer, M8, are arranged in a non-uniform fashion with some areas of the top metal layer, M8, having larger numbers of bumps (44) than other areas.

SUMMARY OF INVENTION

According to one aspect of the present invention, a bump and vias structure comprises a metal layer; a bump mounted on the metal layer; a first plurality of vias disposed on a first outer region of the metal layer, where the first outer region has a first density of vias; and a second plurality of vias disposed on a second outer region of the metal layer, where the second outer region has a second density of vias; and where the first density and second density are greater than a third density of vias disposed on a central region between the first and second outer regions.

According to another aspect, an integrated circuit comprises a metal layer; a bump mounted on the metal layer; a first plurality of vias disposed on a first outer region of the metal layer, where the first outer region has a first density of vias; and a second plurality of vias disposed on a second outer region of the metal layer, where the second outer region has a second density of vias; and where the first density and second density are greater than a third density of vias disposed on a central region between the first and second outer regions.

According to another aspect, a method for reducing current crowding in a bump and vias structure comprises distributing current from a first outer region of a metal layer to a bump mounted on the metal layer, where the first outer region has a first density of vias; and distributing current from a second outer region of the metal layer to the bump, where the second outer region has a second density of vias, and where the first density and second density are greater than a third density of vias disposed in a central region between the first and second outer regions.

According to another aspect, a method for reducing current crowding on a bump comprises defining a first region and a second region on a metal layer to which the bump is mounted; determining a first current path length from the first region to the bump; determining a second current path length from the second region to the bump; disposing a first plurality of vias in the first region at a first density depending on the first current path length; and selectively disposing a second plurality of vias in the second region at a second density depending on the second current path length.

Other aspects and advantages of the invention will be apparent from the following description and the appended claims.

BRIEF DESCRIPTION OF DRAWINGS

FIG. 4b shows another view of the typical integrated circuit shown in FIG. 4a.

FIG. 5b shows a top view of a bump and vias structure in accordance with the embodiment shown in FIG. 5a.

FIG. 6b shows a top view of a bump and vias structure in accordance with the embodiment shown in FIG. 6a.

FIG. 7b shows a top view of a bump and vias structure in accordance with the embodiment shown in FIG. 7a.

DETAILED DESCRIPTION

Detailed exemplary embodiments of the present invention will now be described with reference to the accompanying figures. Embodiments of the present invention are related to a bump and vias structure that allows for increased uniformity of current distribution around the bump. Embodiments of the present invention further relate to a method for reducing current crowding by more uniformly distributing current to and from a bump.

Figure 1:
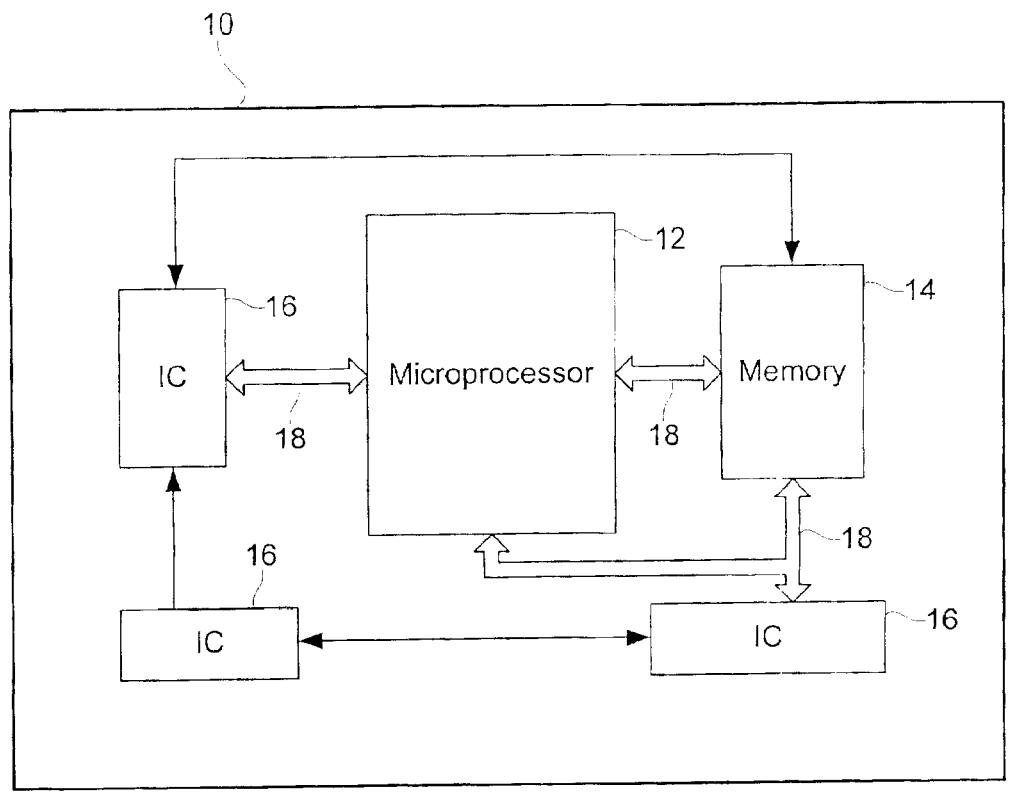
FIG. 1 shows a typical computer system.
Figure 2:
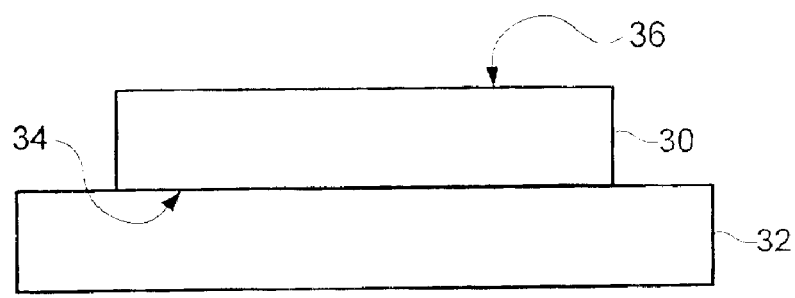
FIG. 2 shows a typical chip package assembly.
Figure 3:
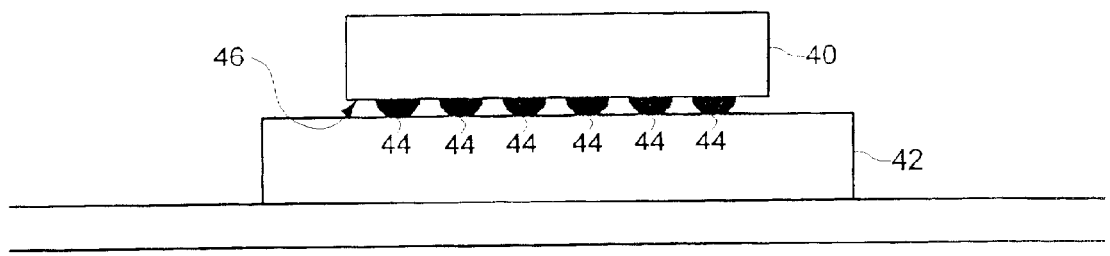
FIG. 3 shows a typical flip-chip package assembly.
Figure 4A:
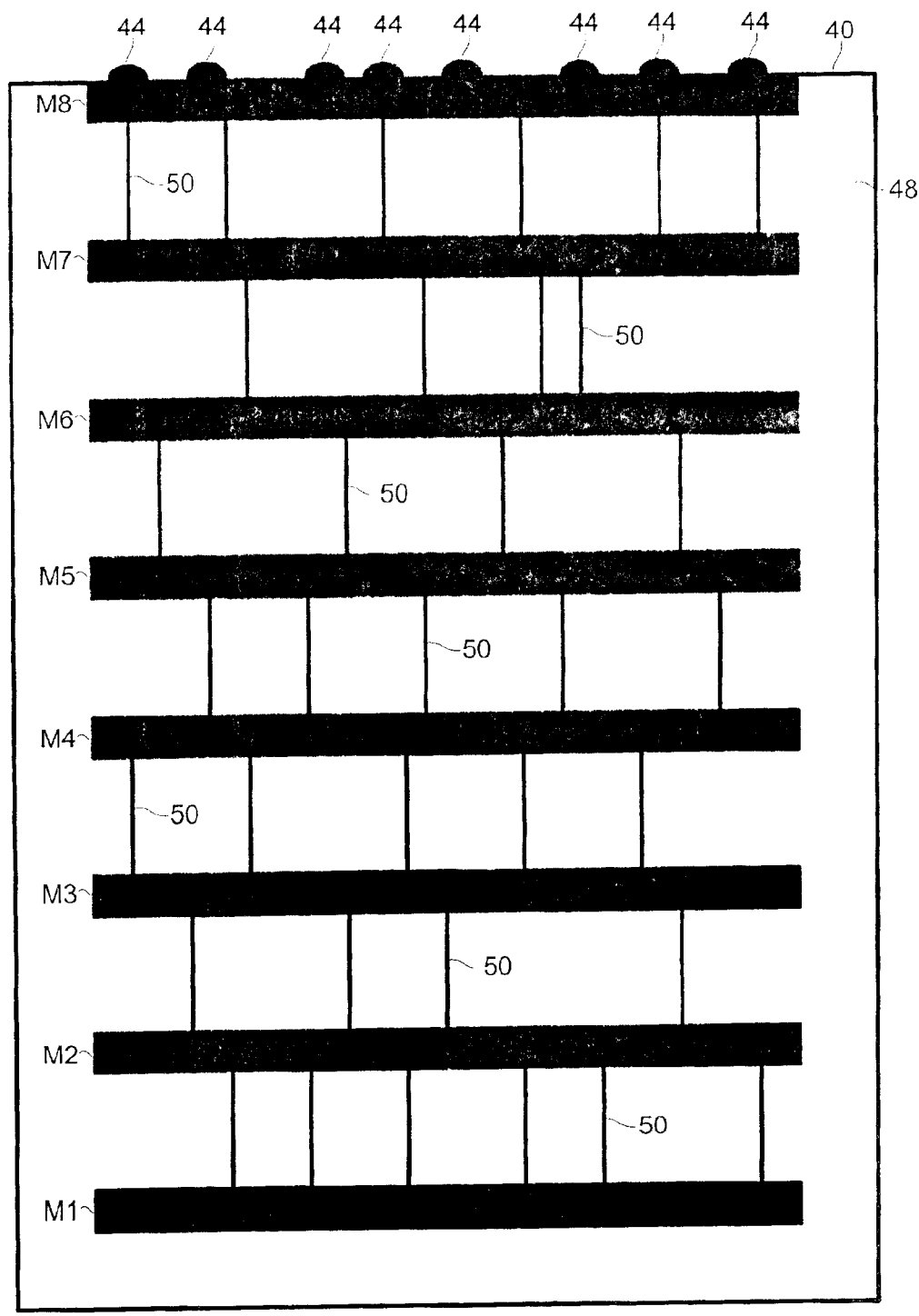
FIG. 4a shows a view of a typical integrated circuit.
Figure 4B:
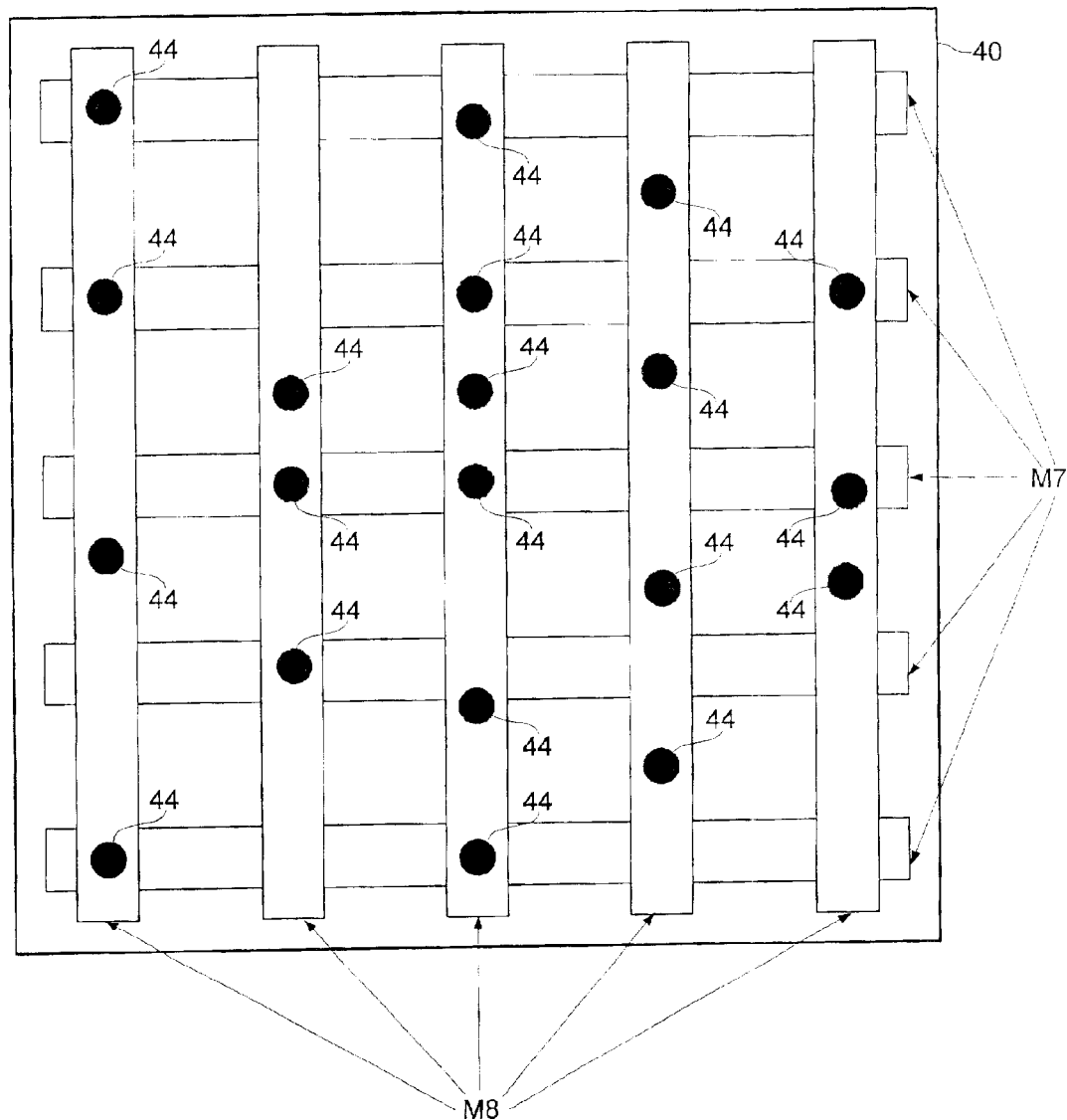
Figure 4C:
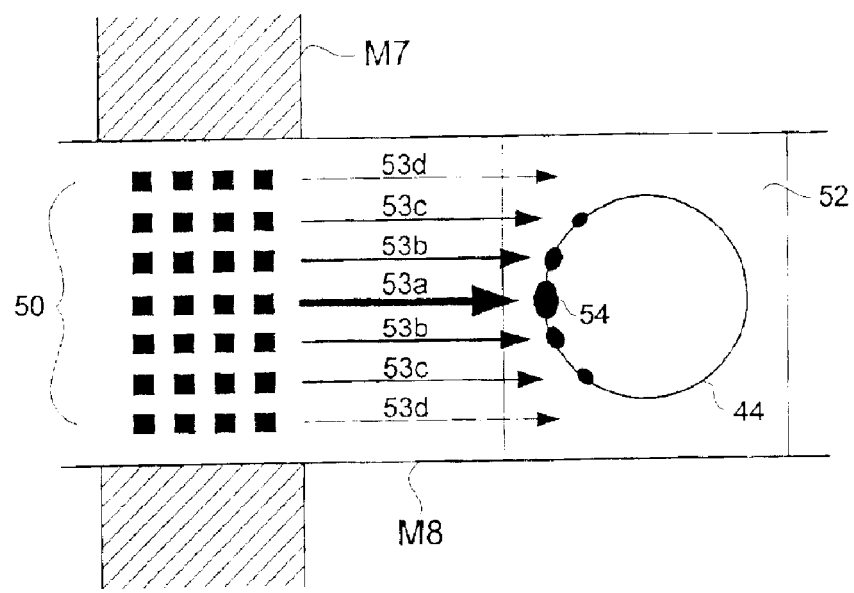
FIG. 4c shows an enlarged view of a bump and vias structure in accordance with the examples shown in FIGS. 4a and 4b.

FIG. 4c shows an enlarged section of the integrated circuit (40) shown in FIG. 4b. Although a section of an integrated circuit is used for this example, the invention is equally applicable to all bump and vias structures in an integrated circuit. The bump (44) shown in FIG. 4c is connected to the top metal layer, M8. Vias (50) are used to connect the bump (44), the top metal layer, M8, and the one or more metal layers below (shown here as layer M7).

Vias (50) provide current paths across the junction between the bump (44) and the top metal layer, M8. The part of the top metal layer, M8, that makes contact with the bump is known as its "landing pad" (52). Thus, current is carried to or from the bump (44) from or to the vias (50) by layer M8 and the landing pad (52). Arrows indicating the flow of current from the bump (44) to the vias (50) are shown for illustration purposes in FIG. 4c. Although the vias (50) facilitate current flow, because the vias (50) are positioned laterally across the layer M8, and the bump (44) is circular, there is non-uniform current density at the junction between the bump (44) and the top metal layer, M8. This non-uniform current density, resulting from the differences in current path length from the vias (50) to the bump (44), is known as "current crowding." In this current crowding phenomenon, there is high current density at a region (54) of the bump (44) that is in closest proximity to the vias (50), and there is lower current density in the rest of the junction between the bump (44) and the landing pad (52). For example, in FIG. 4c, it can be seen that the shortest current path length is along arrow (53a), resulting in current crowding in region (54). A lower concentration of current flow occurs along arrows (53b), and even lower concentrations of current flow occur along arrows (53c, 53d). Those skilled in the art will note that in FIG. 4c, the relative thicknesses among arrows from the vias (50) to the bump (44) are indicative of the relative current densities of the various current flow paths. For example, arrow (53a) has a higher current density than arrows (53c), and thus arrow (53a) is thicker than arrows (53c).

Current crowding is typically an undesirable effect because prolonged exposure to current crowding may cause, among other things, performance degradation, power distribution deficiencies, signal delay, and damage to the junction between the bump (44) and the landing pad (52). In some cases, damage caused by electro-migration may actually result in detachment of the bump.

Figure 5A:
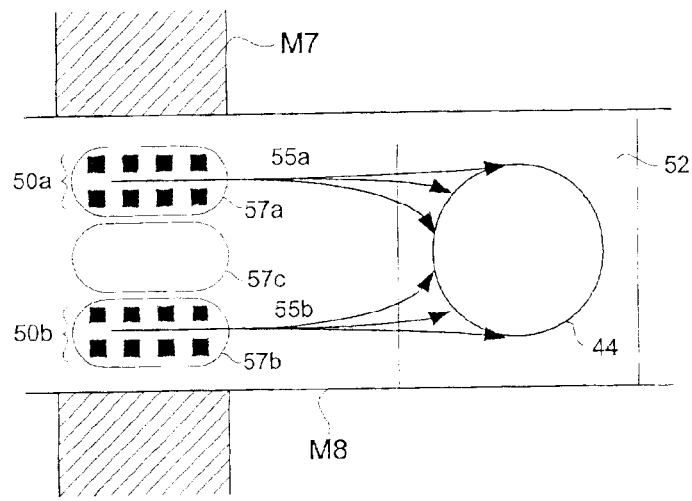
FIG. 5a shows a top view of a bump and vias structure in accordance with an embodiment of the present invention.

FIG. 5a shows a top view of a bump and vias structure in accordance with an embodiment of the invention. In the prior art example shown in FIG. 4c, current crowding occurred due to the current concentration along the central current flow path, i.e., arrow (53a). In the embodiment shown in FIG. 5a, the vias (50) have been separated into vias (50a) in a first outer region (57a) and vias (50b) in a second outer region (57b). In this embodiment, the vias have been removed from a central region (57) in between the first and second outer regions (57a and 57b), and have been concentrated along the outer regions (57a and 57b) of layer M8. Thus, vias (50a) cause a concentration of current to flow along arrow (55a), while vias (50b) cause a concentration of current to flow along arrow (55b). Because of the relative lack of current sources, i.e., vias, in the central region (57c), it can be seen that the current path lengths from the vias (50a and 50b) to the bump (44) are all virtually the same. Accordingly, current uniformity at the bump (44) is increased. Correspondingly, current crowding, and the resulting performance degradation, are decreased.

Figure 5B:
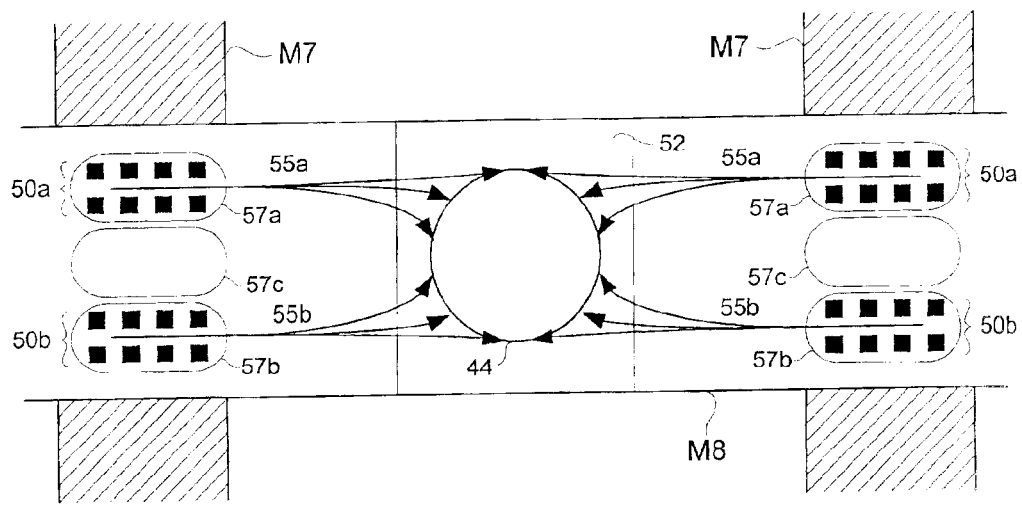

FIG. 5b shows a top view of a bump and vias structure in accordance with the embodiment shown in FIG. 5a. In FIG. 5b, current distribution to the bump (44) is shown where vias are positioned on the metal layer, M8, on both sides of the bump (44). Current to the bump flows from the outer regions (57a) and (57b), as shown by arrows (55a and 55b), and because of the lack of vias in the central region (57c), it can be seen that the current path lengths from the vias (50a and 50b) to the bump (44) are all substantially the same. Thus, as shown in FIG. 5b, the bump (44) experiences substantially uniform current distribution from the vias, effectively reducing current crowding at isolated points of the bump (44).

Figure 6A:
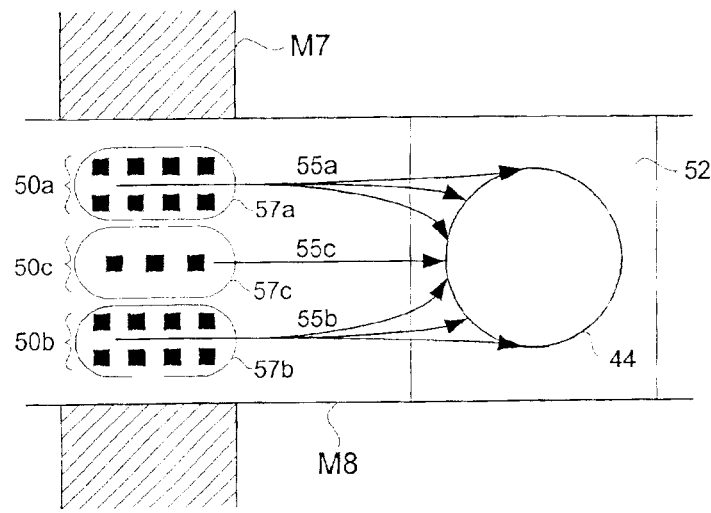
FIG. 6a shows a top view of a bump and vias structure in accordance with another embodiment of the present invention.

Turning now to FIG. 6a, an alternative embodiment of the present invention is shown. In this embodiment, in addition to a relatively dense distribution of vias within the outer regions (57a and 57b) of layer M8, vias (50c) are disposed in the central region (57c), but are disposed more sparsely than vias (50a and 50b) in the outer regions (57a and 57b). Thus, by virtue of a lesser density of current flowing toward the bump (44) from the central region (57c) than current flowing from toward the bump (44) from the outer regions (57a and 57b), the differences in current path length to the bump (44) are compensated for by the differences in current injection. Accordingly, current crowding at the bump (44) is reduced.

Figure 6B:
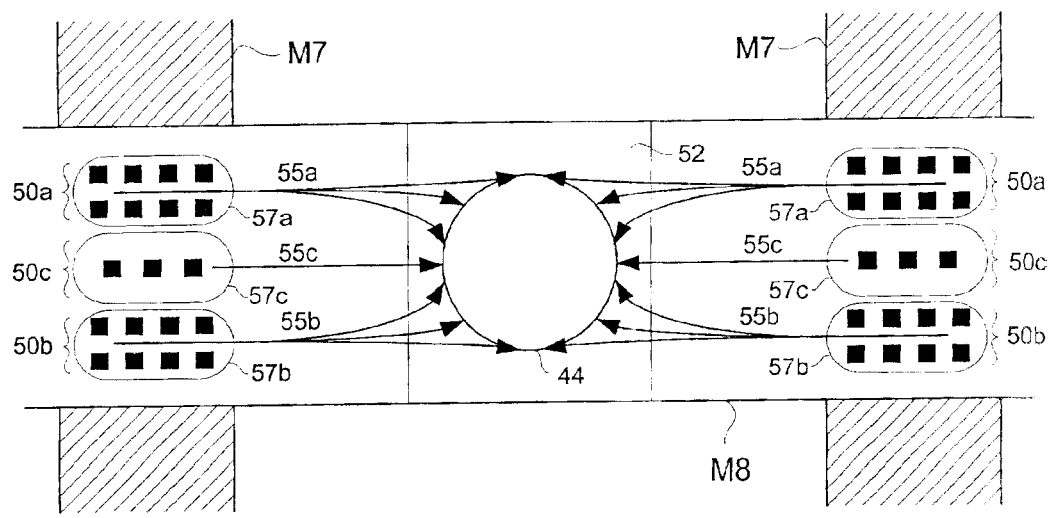

FIG. 6b shows a top view of a bump and vias structure in accordance with the embodiment shown in FIG. 6a. In FIG. 6b, current distribution to the bump (44) is shown where vias are positioned on the metal layer, M8, on both sides of the bump (44). Because outer regions (57a and 57b) have higher via density than the central regions (57c) of the metal layer, M8, higher current flow densities from the outer regions (57a and 57b) to the bump (44) compensate for the longer current flow paths (arrows 55a and 55b) from the outer regions (57a and 57b) to the bump (44) relative to that of current flow path from the central region (57c) to the bump (44). Thus, as shown in FIG. 6b, the bump (44) experiences substantially uniform current distribution, effectively reducing current crowding at isolated points of the bump (44).

Figure 7A:
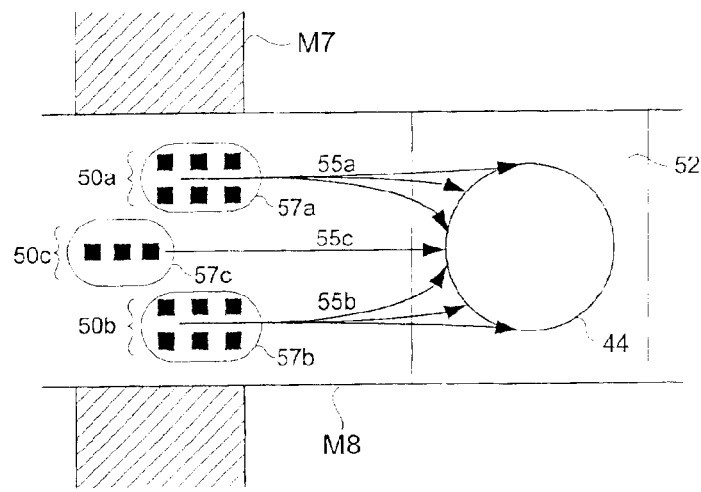
FIG. 7a shows a top view of a bump and vias structure in accordance with another embodiment of the present invention.

Turning now to FIG. 7a, an alternative embodiment of the present invention is shown. In this embodiment, in addition to a relatively dense distribution of vias within the outer regions (57a and 57b) of layer M8, vias (50c) are disposed in the central region (57c), but are disposed more sparsely than vias (50a and 50b) in the outer regions (57a and 57b), where the central region (57c) is positioned further away from the bump (44) than the outer regions (57a and 57b). Thus, by virtue of a lesser density of current flowing toward the bump (44) from the central region (57c) than current flowing from toward the bump (44) from the outer regions (57a and 57b), and by virtue of the central region (57c) being disposed further from the bump (44) than the outer regions (57a and 57b), the differences in current path length to the bump (44) are compensated for by the differences in current injection. Accordingly, current crowding at the bump (44) is reduced.

Figure 7B:
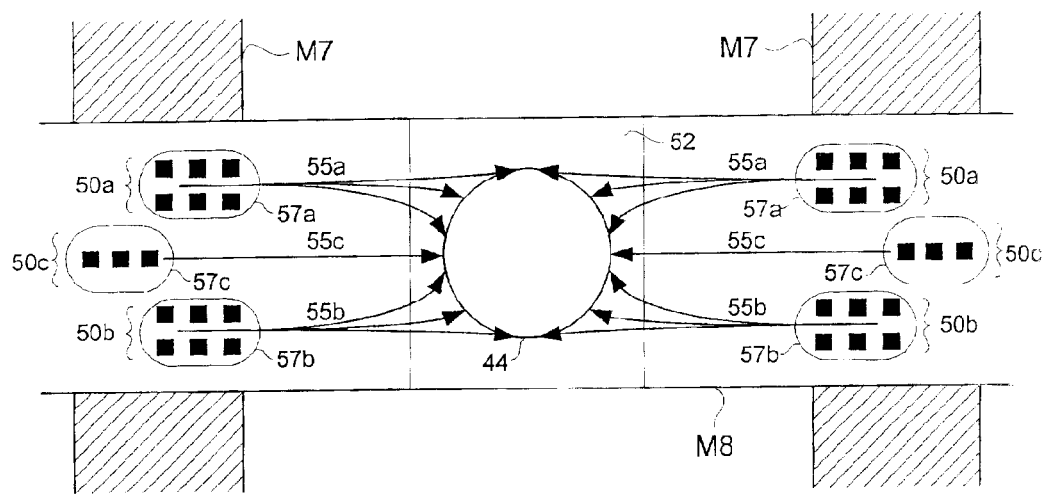

FIG. 7b shows a top view of a bump and vias structure in accordance with the embodiment shown in FIG. 7a. In FIG. 7b, current distribution to the bump (44) is shown where vias are positioned on the metal layer, M8, on both sides of the bump (44). Because outer regions (57a, 57b) have higher via density than the central regions (57c) of the metal layer, M8, and because the central region (57c) is disposed further from the bump (44) than the outer regions (57a and 57b), the differences in current path lengths to the bump (44) are compensated for by the differences in current injection. Thus, as shown in FIG. 7b, the bump (44) experiences substantially uniform current distribution, effectively reducing current crowding at isolated points of the bump (44).

Although, in the exemplary embodiments above, current is shown as flowing from the vias to the bump, the invention is equally applicable for situations where current flows from the bump to the vias.

In the exemplary embodiments above, it has been shown that current uniformity at the bump can be increased, and current crowding decreased, by selectively injecting current from desired regions of a metal layer to a bump. In the examples above, these regions have been described as the outer regions (57a and 57b) of the layer M8, represented by the location of the vias (50a and 50b), and a central region (57c), represented by the location of the vias (50c). Although the metal layer, M8, has been divided into these three regions for purposes of illustration, the skilled artisan will understand that the metal layer may be divided into any number of regions, and the distribution of vias adjusted accordingly, to result in the desired distribution of current injection. Thus, the embodiments of FIGS. 5a thru 7b serve for illustration purposes only, and should not be considered to limit the invention.

The invention further relates to a method of reducing current crowding at a bump using selective current injection. In accordance with the method of the invention, a metal layer to which a bump is connected is divided into a plurality of regions. Within each of the plurality of regions, vias are then distributed at varying densities to produce a level of current injection that compensates for differences in path length from each region to the bump.

While the invention has been shown and described above with respect to particular exemplary embodiments, the skilled artisan will recognize that various modifications and additions to the disclosed embodiments may be made without departing from the spirit and scope of the invention. Accordingly, the invention shall be considered limited only by the scope of the appended claims.

What is claimed is:

1. A bump and vias structure, comprising:
    a metal layer;
    a bump mounted on a landing pad portion of the metal layer;
    a first plurality of vias connected to a first outer region of the metal layer, wherein the first outer region is connected to a first density of vias; and
    a second plurality of vias connected to a second outer region of the metal layer, wherein the second outer region is connected to a second density of vias,
    wherein the first density and second density are greater than a third density of vias connected to a central region between the first and second outer regions, and
    wherein an area of the metal layer linearly extending from an edge of the metal layer to another edge of the metal layer is laterally disposed between the landing pad portion and both the first plurality of vias and the second plurality of vias, and
    wherein there is an absence of vias between the area and the bump.

2. The bump and vias structure of claim 1, wherein the first density is substantially equal to the second density.

3. The bump and vias structure of claim 1, wherein a first current path from the first outer region to the bump is substantially equal to a second current path from the second outer region to the bump.

4. The bump and vias structure of claim 1, wherein there are no vias in the central region.

5. The bump and vias structure of claim 1, wherein current injection from the first outer region to the bump is greater than current injection from the central region to the bump.

6. The bump and vias structure of claim 1, wherein current injection from the second outer region to the bump is greater than current injection from the central region to the bump.

7. The bump and vias structure of claim 1, wherein the central region is positioned further from the bump than the first and second outer regions.

8. An integrated circuit, comprising:
    a metal layer;
    a bump mounted on a landing pad portion of the metal layer;
    a first plurality of vias connected to a first outer region of the metal layer, wherein the first outer region is connected to a first density of vias; and
    a second plurality of vias connected to a second outer region of the metal layer, wherein the second outer region is connected to a second density of vias,
    wherein the first density and second density are greater than a third density of vias connected to a central region between the first and second outer regions, and
    wherein an area of the metal layer linearly extending from an edge of the metal layer to another edge of the metal layer is laterally disposed between the landing pad portion and both the first plurality of vias and the second plurality of vias, and
    wherein there is an absence of vias between the area and the bump.

9. The integrated circuit of claim 8, wherein the first density is substantially equal to the second density.

10. The integrated circuit of claim 8, wherein a first current path from the first outer region to the bump is substantially equal to a second current path from the second outer region to the bump.

11. The integrated circuit of claim 8, wherein there are no vias in the central region.

12. The integrated circuit of claim 8, wherein current injection from the first outer region to the bump is greater than current injection from the central region to the bump.

13. The integrated circuit of claim 8, wherein current injection from the second outer region to the bump is greater than current injection from the central region to the bump.

14. The integrated circuit of claim 8, wherein the central region is positioned further from the bump than the first and second outer regions.

15. A method for reducing current crowding in a bump and vias structure, comprising:

distributing current from a first outer region of a metal layer to a bump mounted on a landing pad portion of the metal layer, wherein the first outer region is connected to a first density of vias; and distributing current from a second outer region of the metal layer to the bump, wherein the second outer region is connected to a second density of vias, wherein the first density and second density are greater than a third density of vias connected to a central region between the first and second outer regions, and wherein an area of the metal layer linearly extending from an edge of the metal layer to another edge of the metal layer is laterally disposed between the landing pad portion and both the first density of vias and the second density of vias, and wherein there is an absence of vias between the area and the bump.

16. The method of claim 15, wherein the first density is substantially equal to the second density.

17. The method of claim 15, wherein a first current path from the first outer region to the bump is substantially equal to a second current path from the second outer region to the bump.

18. The method of claim 15, wherein there are no vias in the central region.

19. The method of claim 15, wherein current injection from the first outer region to the bump is greater than current injection from the central region to the bump.

20. The method of claim 15, wherein current injection from the second outer region to the bump is greater than current injection from the central region to the bump.

21. The method of claim 15, wherein the central region is positioned further from the bump than the first and second outer regions.

22. A method for reducing current crowding on a bump, comprising:

defining a first region and a second region on a metal layer having a landing pad portion to which the bump is mounted;

determining a first current path length from the first region to the bump;

determining a second current path length from the second region to the bump;

selectively disposing a first plurality of vias in the first region at a first density depending on the first current path length; and selectively disposing a second plurality of vias in the second region at a second density depending on the second current path length.

23. The method of claim 22, wherein the first current path length is longer than the second current path length, and wherein the first density is greater than the second density.

24. The method of claim 22, wherein the second plurality of vias is disposed further from the bump than the first plurality of vias.

25. The method of claim 22, further comprising:

defining a third region on the metal layer;

determining a third current path length from the third region to the bump; and disposing a third plurality of vias in the third region at a third density depending on the third current path length.

26. The method of claim 25, wherein the third current path length is longer than the second current path length, and wherein the third density is greater than the second density.

27. The method of claim 25, wherein the second plurality of vias is disposed further from the bump than the third plurality of vias.

28. The method of claim 25, wherein the first density is substantially equal to the third density.

* * * * *